(12) United States Patent
Yamaguchi et al.

(10) Patent No.: US 6,577,507 B2
(45) Date of Patent: Jun. 10, 2003

(54) AUTOMATIC CIRCUIT BOARD PLUG-IN SYSTEM

(75) Inventors: Kentaro Yamaguchi, Tokyo (JP); Hiroshi Suzuki, Chiba (JP); Makoto Kabe, Chiba (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/231,081

(22) Filed: Aug. 30, 2002

(65) Prior Publication Data

US 2003/0072139 A1 Apr. 17, 2003

(30) Foreign Application Priority Data

Oct. 16, 2001 (JP) ........................................ 2001-317737

(51) Int. Cl.[7] ................................................ H05K 5/00
(52) U.S. Cl. ...................... 361/754; 361/756; 361/759; 439/159
(58) Field of Search ...................... 361/737, 724–727, 361/740, 741, 747, 754, 756, 759, 788, 798, 796, 801, 802; 439/159, 310, 177

(56) References Cited

U.S. PATENT DOCUMENTS

| 5,619,660 A | * | 4/1997 | Scheer et al. ............... 395/282 |
| 6,345,996 B2 | * | 2/2002 | Saito et al. ................. 439/159 |
| 6,399,887 B1 | * | 4/2002 | Lin ....................... 174/138 D |
| 6,394,828 B1 | * | 5/2002 | Kodama et al. ............. 439/159 |
| 6,406,322 B1 | * | 6/2002 | Barringer et al. ........... 439/377 |

* cited by examiner

*Primary Examiner*—David Martin
*Assistant Examiner*—Phuong T. Vu
(74) *Attorney, Agent, or Firm*—Rabin & Berdo, P.C.

(57) ABSTRACT

A circuit board plug-in system includes a frame, a mother board mounted on the frame and including a mother board connector, and a circuit board including a circuit board connector capable of mating with the mother board connector. Guide rails are mounted on the frame, and each is formed with a channel for the insertion of the circuit board. An actuator moves, under the control of a plug-in controller, the circuit board inserted into the guide rails to thereby selectively connect or disconnect the circuit board connector to or from the mother board connector. The actuator is arranged partly on the circuit board and partly on the guide rails. The plug-in controller is mounted on the frame.

14 Claims, 12 Drawing Sheets

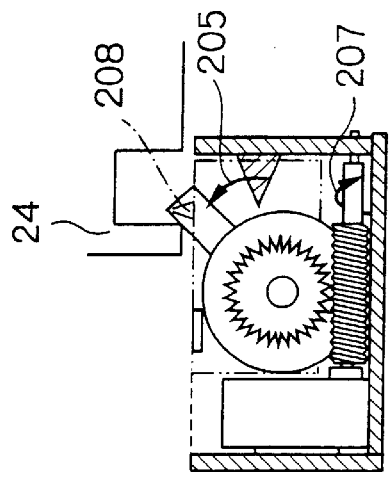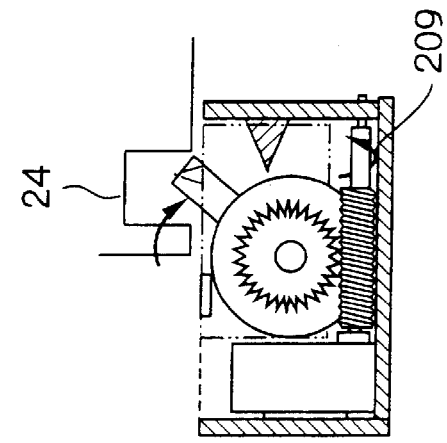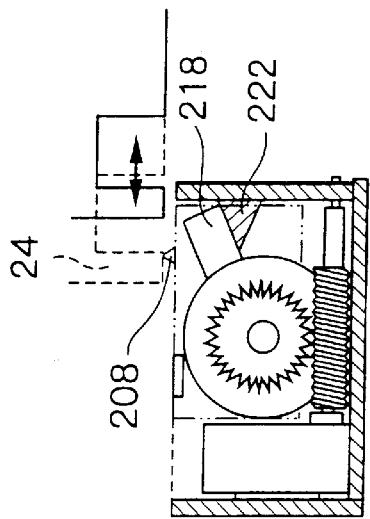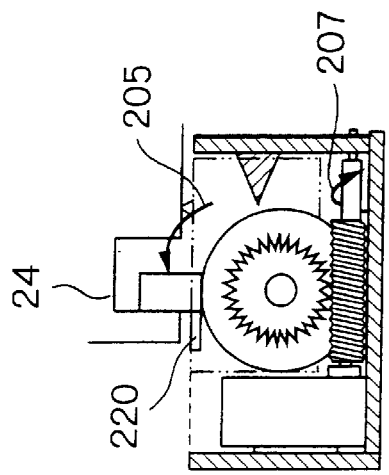

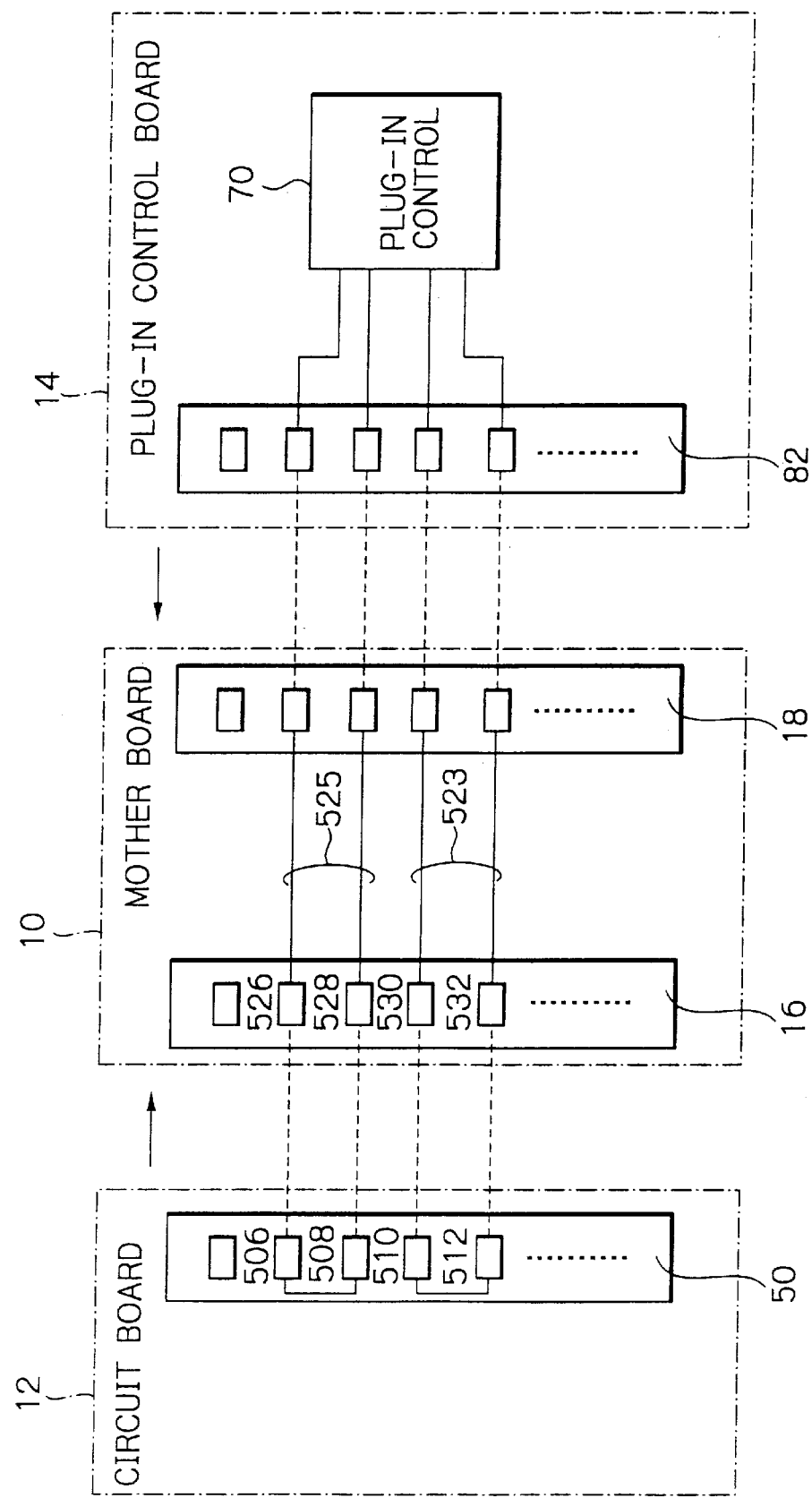

1

AUTOMATIC CIRCUIT BOARD PLUG-IN SYSTEM

BACKGROUND OF THE INVENTION

1. Field of the Invention

The present invention relates to a plug-in system for automatically plugging a CPU (Central Processing Unit) board or similar processor system electronics board into a mother board or back plane.

2. Description of the Background Art

An apparatus of the type using a compact PCI (Peripheral Components Interconnect) bus or similar high-availability bus system is known and includes a CPU board having a bus control capability. The CPU board of this type of apparatus must be one exclusively designed for a high-availability system. More specifically, a switchover function essential with a high-availability system is generally implemented by the electrical disconnection of a CPU board from a bus. It has therefore been customary to mount a circuit for such electrical disconnection on a CPU board exclusive for a high-availability system. This has heretofore obstructed the application of general-purpose CPU boards lacking high availability to high-availability systems due to no provision of such a disconnecting circuit.

To electrically disconnect the CPU board from the bus, the CPU board may be physically pulled out. However, a conventional plug-in mechanism relies on a manual lever in connecting or disconnecting the CPU board and therefore cannot perform automatic connection and disconnection.

A problem with the exclusive CPU boards for high-availability applications and loaded with the disconnecting circuit is that they are not produced on a quantity basis and are therefore more expensive than a general-purpose CPU board. Another problem is that the performance of the exclusive CPU board is generally poor against the cost because latest devices and technologies are, in many cases, applied thereto later than to a general-purpose CPU board.

Although general-purpose CPU boards are less expensive than the exclusive CPU boards, they cannot be directly applied to a high-availability system due to the lack of the disconnecting circuit.

SUMMARY OF THE INVENTION

It is an object of the present invention to provide a circuit board plug-in system capable of automatically interrupting electrical connection between a circuit board and a mother board or back plane, there by allowing a general-purpose circuit board to be applied to a high-availability system.

A circuit board plug-in system in accordance with the present invention includes a frame, a mother board mounted on the frame and including a mother board connector, and a circuit board including a circuit board connector capable of mating with the mother board connector. Guide rails are mounted on the frame, and each is formed with a channel for the insertion of the circuit board. An actuator moves, under the control of a plug-in control section, the circuit board inserted into the guide rails to thereby selectively connect or disconnect the circuit board connector to or from the mother board connector. The actuator is arranged partly on the circuit board and partly on the guide rails. The plug-in control section is mounted on the frame.

BRIEF DESCRIPTION OF THE DRAWINGS

The objects and features of the present invention will become more apparent from consideration of the following detailed description taken in conjunction with the accompanying drawings in which.

FIGS. 8A through 8D are partly sectional views useful for understanding the operation of the plug-in mechanism of FIG. 3;

FIG. 10 is a schematic block diagram showing an alternative embodiment of the present invention;

DESCRIPTION OF THE PREFERRED EMBODIMENTS

Figure 1:
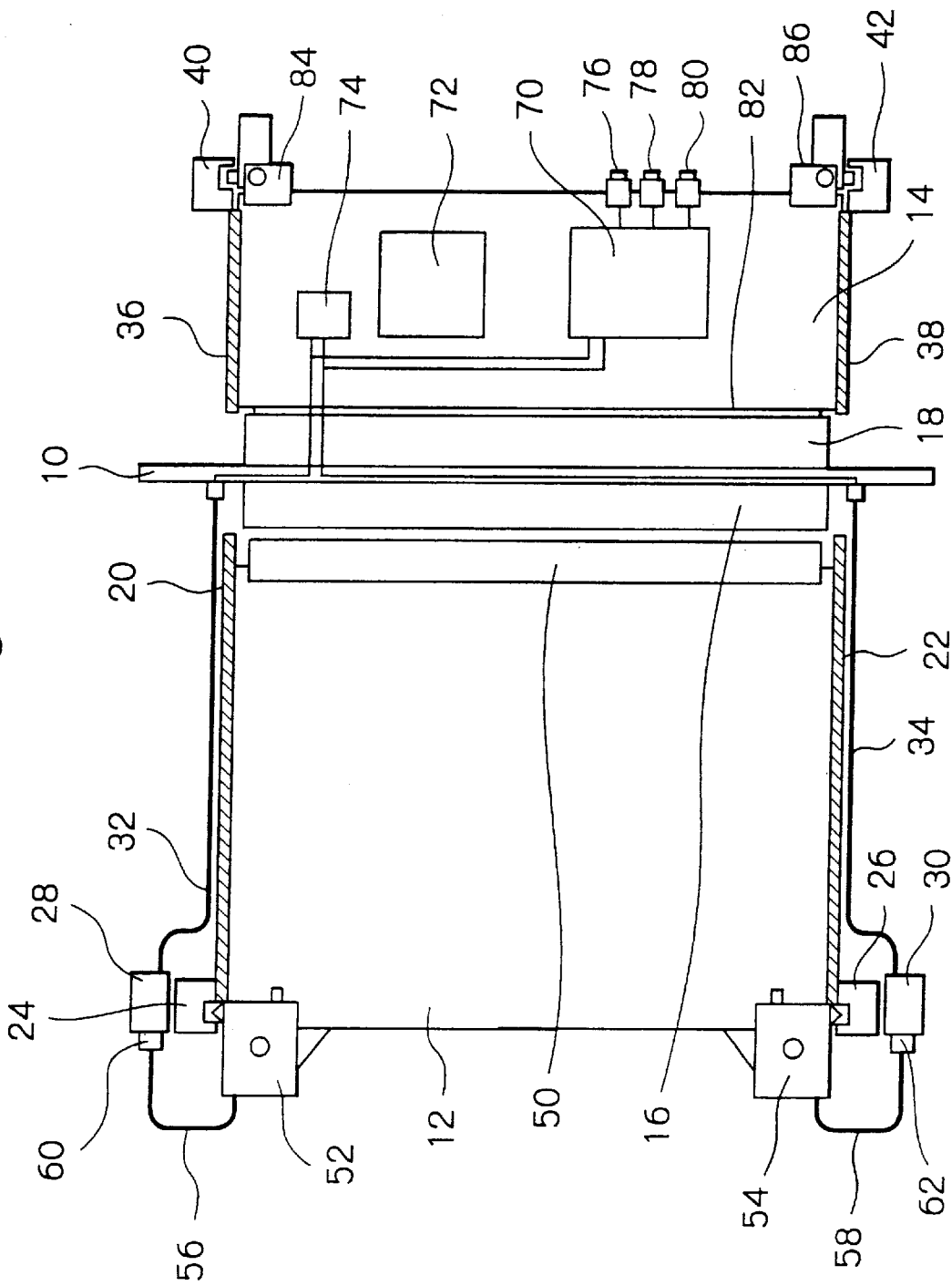
FIG. 1 is a plan view showing a circuit board plug-in system embodying the present invention.

Referring to FIG. 1 of the drawings, a circuit board plug-in system in accordance with an embodiment of the present invention is configured to plug a circuit board 12 in a mother board 10, which may be a back plane. The mother board 10 is mounted on a frame not shown. The reference numeral 14 designates a plug-in control board. The mother board 10 has its opposite surfaces having mother board connectors 16 and 18 respectively mounted thereon. The mother board connectors 16 and 18 are connected to each other and to other connectors, not shown, via an electrically conductive circuit pattern formed on the mother board 10.

At the left-hand side of the mother board 10, as seen in FIG. 1, parallel guide rails 20 and 22 are mounted on the frame at a preselected distance from each other. The guide rails 20 and 22 each are formed with a channel for receiving one edge of the circuit board 12. On the ends of the guide rails 20 and 22 remote from the mother board 10, locking members 24 and 26 are respectively mounted, and each formed with a notch for locking the circuit board 12 to the associated guide rail 20 or 22. On the portions of the frame adjoining the locking members 24 and 26, control cable connectors 28 and 30 are respectively mounted. The control cable connectors 28 and 30 accommodate one end of a control cable 32 and one end of a control cable 34, respectively. The control cables 32 and 34 each include a feed wire assigned to drive pulses and a signal wire assigned to sense signals. The control cables 32 and 34 have other ends thereof connected to the mother board connector 18 via the conductive pattern, which is formed on the mother board 10.

At the right-hand side of the mother board 10, as seen in FIG. 1, parallel guide rails 36 and 38 are mounted on the frame also at a preselected distance from each other. The guide rails 36 and 38 each are formed with a channel for receiving one edge of the plug-in control board 14. On the ends of the guide rails 36 and 38 remote from the mother board 10, locking members 40 and 42 are respectively mounted, and each formed with a notch for locking the plug-in control board 14 to the associated guide rail 36 or 38. The locking members 40 and 42 may be identical in configuration with the locking members 24 and 26.

The circuit board 12A has a processor system, such as a CPU, mounted thereon. On the right edge portion of the circuit board 12 as seen in FIG. 1, a circuit board connector 50 is mounted. On the left edge portion of the circuit board 12 at the top and bottom, respectively, as seen in the figure, mounted are plug-in mechanisms 52 and 54. The plug-in mechanisms 52 and 54 and locking members 24 and 26 stated earlier constitute an actuator in combination for selectively connecting or disconnecting the circuit board 12 to or from the mother board 10. The plug-in mechanisms 52 and 54 accommodate one end of a control cable 56 and one end of a control cable 58, respectively. The control cables 56 and 58 each include a feed wire assigned to drive pulses and a signal wire assigned to sense signals. The control cables 56 and 58 have the other ends thereof respectively accommodated in the control cable connectors 60 and 62, which are connected to the control cable connectors 28 and 30, respectively.

Figure 2:
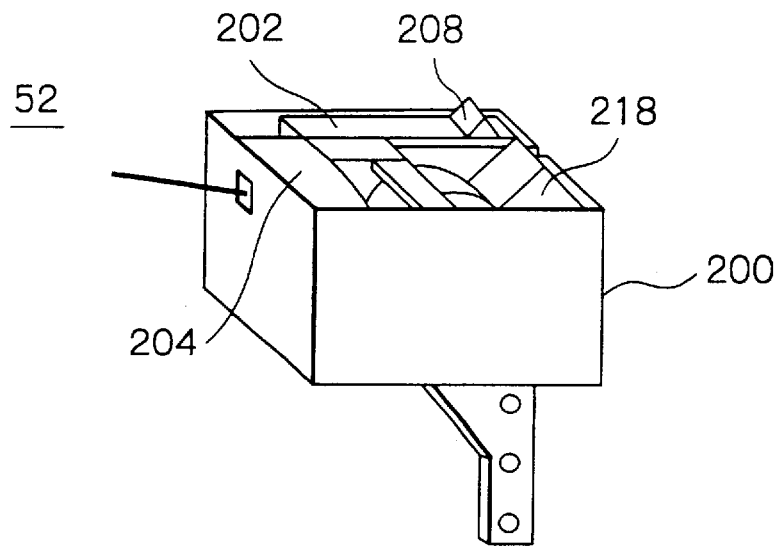
FIG. 2 is a perspective outside view showing a specific configuration of a plug-in mechanism included in the illustrative embodiment shown in FIG. 1.
Figure 3:
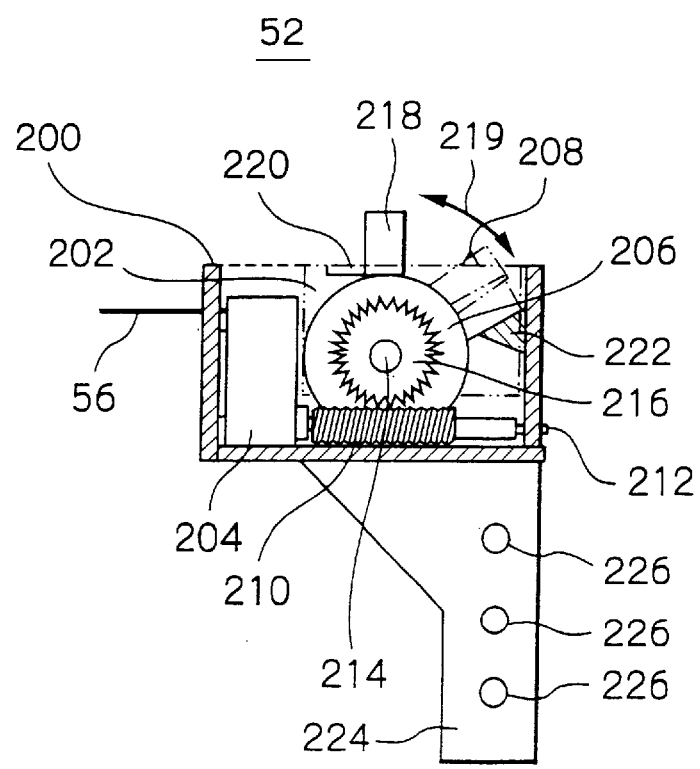
FIG. 3 is a partly sectional view showing the plug-in mechanism of FIG. 2.

FIGS. 2 and 3 show a specific configuration of the plug-in mechanism 52. The other plug-in mechanism 54 is identical in configuration with the plug-in mechanism 52 and will not be described specifically in order to avoid redundancy. As shown, the plug-in mechanism 52 includes a chassis 200 loaded with a microswitch 202, a stepping motor 204, and a rotatable disk 206. The microswitch 202 is positioned such that as witch button 208 thereof protrudes above the top of the chassis 200. The switch button 208 is constantly biased upward by a spring, not shown. The microswitch 202 turns on when the switch button or protrusion 208 is pushed or depressed downward against the action of the spring or turns off when released. The microswitch 202 outputs a sense signal representative of the ON/OFF state of a contact of the switch button 208 to the control cable 56. The microswitch 202, which is responsive to the position of the circuit board 12 relative to the mother board 10, may be replaced with an optical sensor, magnetic sensor or similar sensor, if desired. Such an alternative sensor is longer in service life and more accurate than the mechanical switch although making circuitry sophisticated.

The stepping motor 204 plays the role of a disk drive source for causing the disk 206 to rotate. In the illustrative embodiment, the stepping motor 204 is implemented as a two-phase stepping motor having a 50:1 reduction gear ratio by way of example. The stepping motor 204 rotates in response to drive pulses or currents fed thereto over the control cable 56. The stepping motor 204 has its output shaft, to which a shaft 212 is coaxially affixed at its one end to engage with a worm gear 210. The shaft 212 has its other end rotatably received in a hole, not shown, formed in the chassis 200.

From part of the circumference of the disk 206, a rectangular lug 218 protrudes radially outward. The disk 206 is supported by a rotatable shaft 214 which has a circular gear 216 mounted on its one end. The shaft 214 is rotatably received in holes, not shown, formed in the chassis 200 and extends perpendicularly to the shaft 212 with the gear 216 meshing with the worm gear 210. In this configuration, the rotation of the stepping motor 204 is transmitted to the disk 206 via the worm gear 210 and gear 216, causing the disk 206 to rotate in a direction indicated by a double-headed arrow 219 in FIG. 3. The disk 206 stops rotating when its lug 218 abuts against either one of stops 220 and 222, which are mounted on the chassis 200.

More specifically, when the stepping motor 204 rotates the worm gear 210 clockwise (forward) as seen from the motor 204 side, the disk 206 rotates counterclockwise, as seen in FIG. 3, causing the lug 218 to move out of the chassis 200. The disk 206 then stops rotating when the lug 218 abuts against the stop 220. At this time, the stepping motor or drive source 204 steps out and stops rotating, so that the lug 218 remains in a position protruding vertically above the chassis 200. Conversely, when the worm gear 210 is rotated counterclockwise (reverse) as seen from the motor 204 side, the disk 206 rotates clockwise, as seen in FIG. 3, until the lug 218 moving into the chassis 200 this time abuts against the stop 222. The stepping motor 204 again steps out and stops, maintaining the lug 218 in a position retracted into the chassis 200.

In the illustrative embodiment, the stops 220 and 222 are used to limit the movable range of the lug 218, as stated above. The stops 220 and 222 may, of course, be replaced with microswitches, optical sensors, magnetic sensors or any other suitable sensors so long as they can sense the lug 218 brought to the two positions described above. The outputs of such alternative sensors will be used to stop feeding the drive pulse to the stepping motor 204 and will therefore prevent the stepping motor 204 from stepping out. Although the alternative sensors make the circuitry and structure sophisticated and expensive, they free the mechanism from excessive forces for thereby reducing troubles and extending the service life.

The chassis 200 is affixed to a bracket 224 formed with a plurality of screw holes 226. Via the screw holes 226, screws, not shown, are driven into the circuit board 12 to thereby fasten the chassis 200 to the circuit board 12. It is to be noted that the stepping motors 204 of the two plug-in mechanisms 52 and 54 are driven in synchronism with each other.

Figure 4:
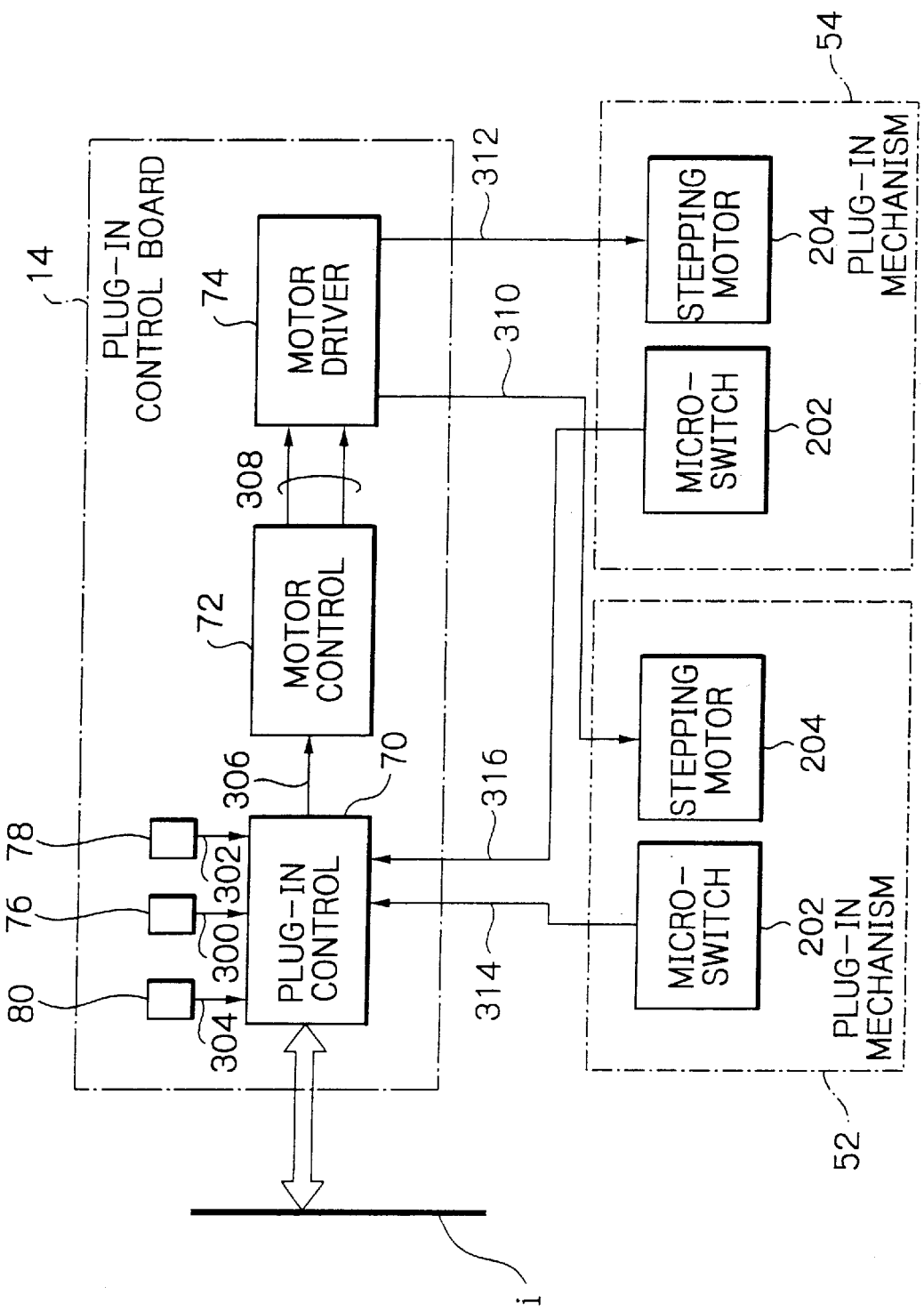
FIG. 4 is a schematic block diagram showing a control system included in the illustrative embodiment.

Referring again to FIG. 1, the plug-in control board 14 is loaded with a plug-in control unit 70, a motor control unit 72, a motor driver 74, an initialize switch 76, a connect switch 78, and a disconnect switch 80. The plug-in control board 14 controls the actuator made up of the plug-in mechanisms 52 and 54 and locking members 24 and 26. FIG. 4 shows the plug-in control section in a schematic block diagram. The plug-in control section cooperates with the above actuator to control the mounting and dismounting of the circuit board 10. As shown in FIG. 1, on the left edge portion of the plug-in control board 14 a control board connector 82 is mounted and connected to the mother board connector 18. On the right edge portion of the plug-in control board 14, plug-in mechanisms 84 and 86 are mounted at the top.and bottom, respectively, as seen in FIG. 1.

The switches 76, 78 and 80 are implemented as pushbutton switches and connected to the plug-in control unit 70. When the initialize switch 76 is pushed, it sends out an initialization command signal 300 to the plug-in control unit 70. This command signal 300 causes the control unit 70 to prepare for the automatic insertion of the circuit board 12 into the mother board 10 (initial state). When the connect switch 78 is pushed, it sends out a connection command signal 302 indicative of the connection of the circuit board connector 50 to the mother board connector 16 to the plug-in control unit 70. Likewise, when the disconnect switch 80 is pushed, it sends out a disconnection command signal 304 indicative of the disconnection of the circuit board connector 50 from the mother board connector 16 to the plug-in control unit 70.

The plug-in control unit 70 includes a watchdog timer, a control register, memories and so forth although not shown specifically. When the plug-in control unit 70 receives any one of the signals 300 through 304 or an access input from the outside via a high-speed bus, e.g., a PCI bus, the plug-in control unit 70 generates a command 306 for controlling the stepping motors 204 in accordance with a preselected procedure and feeds it to the motor controller 72. At this instant, the plug-in control unit 70 monitors signals 314 and 316 respectively output from the plug-in mechanisms 52 and 54 and representative of the position of the circuit board 12.

In response to the command 306 fed from the plug-in control unit 70, the motor control unit 72 generates a control signal 308 indicative of the speed and direction of rotation of the stepping motors 204 and delivers it to the motor driver 74. The motor driver 74 generates drive pulses (drive currents) 310 and 312 in accordance with the control signal 308 and feeds the drive pulses 310 and 312 to the stepping motors 204 of the plug-in mechanisms 52 and 54, respectively. The plug-in mechanisms 84 and 86 mounted on the plug-in control board 14 are operated by hand to lock the board 14 to the guide rails 36 and 38.

Figure 6:
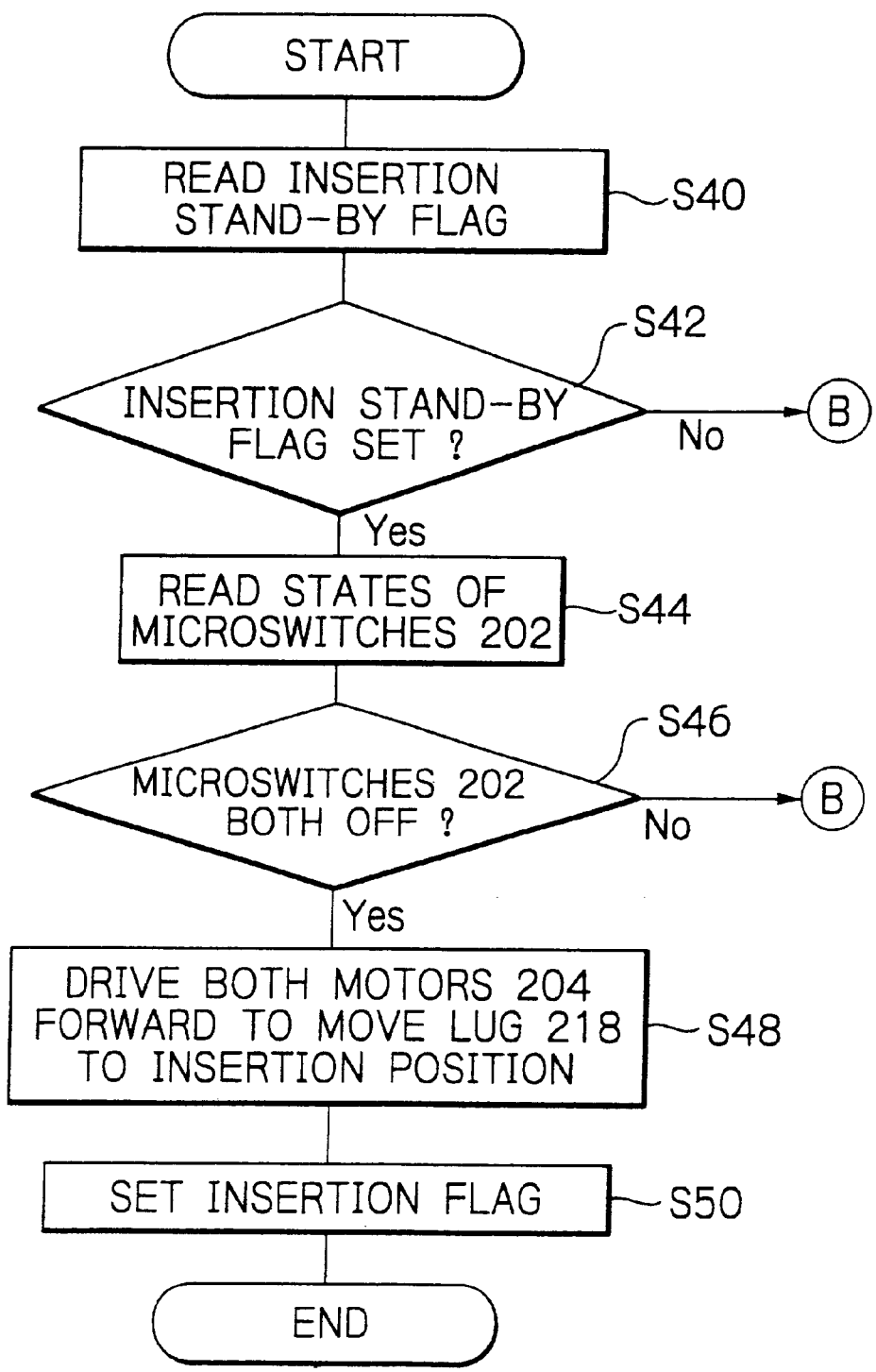
FIG. 6 is a flowchart useful for understanding a specific procedure particular to the illustrative embodiment and executed when a connect switch is pushed.
Figure 7:
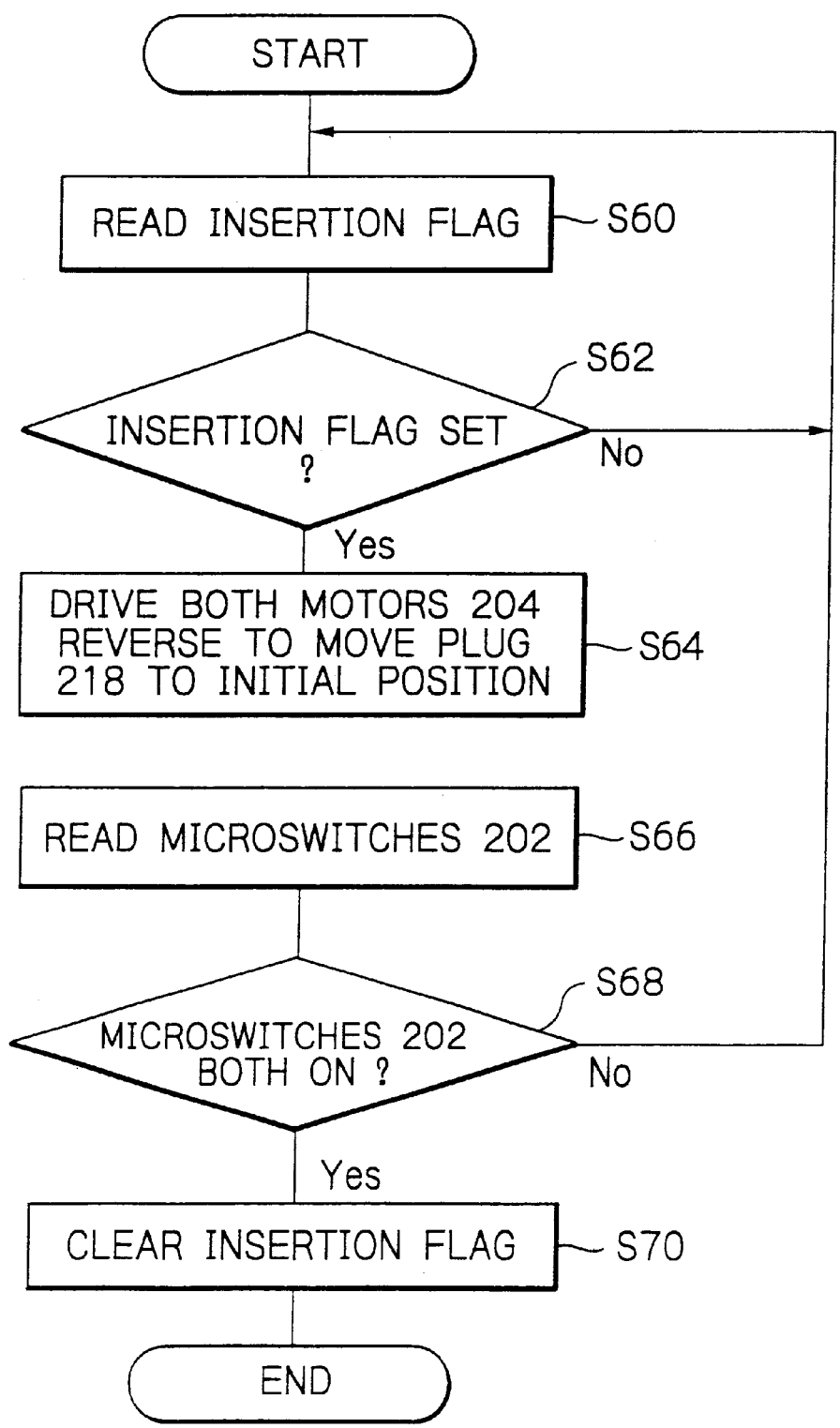
FIG. 7 is a flowchart useful for understanding a specific procedure particular to the illustrative embodiment and executed when a disconnect switch is pushed.

A specific operation of the illustrative embodiment will be described with reference to FIGS. 5, 6 and 7. Assume that the plug-in control board 14 is in an active state. First, the operator inserts the circuit board 12 into the guide rails 20 and 22 and connects the control cable connectors 60 and 62 to the control cable connectors 28 and 30, respectively. As a result, the plug-in mechanisms 52 and 54 are electrically connected to the plug-in control board 14, so that the plug-in control unit 70 is ready to control the plug-in mechanisms 52 and 54. The operator then depresses the initialize switch 76 of the plug-in control board 14. In response, the initialize switch 76 sends out an initialization command 300 to the plug-in control unit 70.

Figure 5:
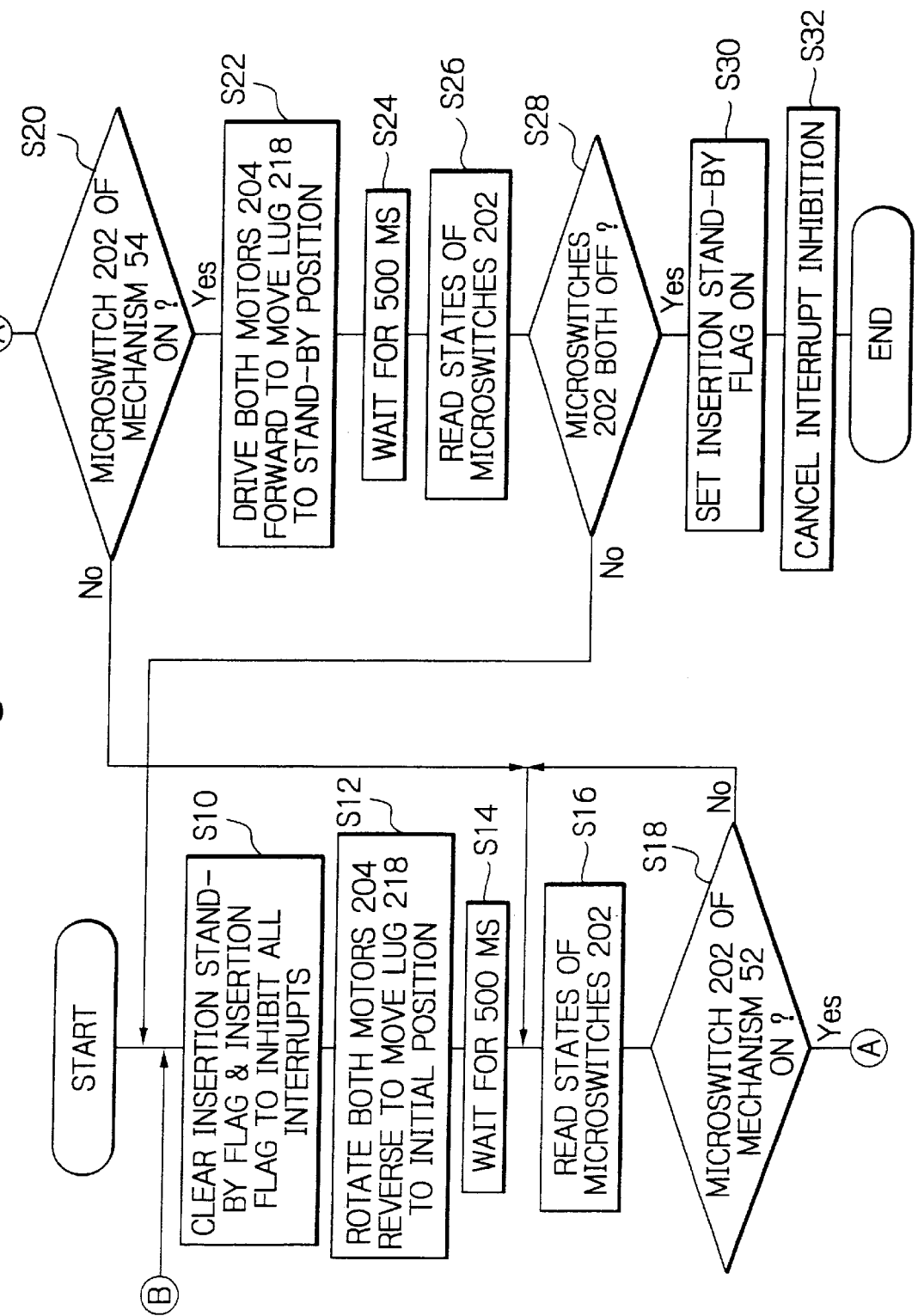
FIG. 5 is a flowchart useful for understanding a specific procedure particular to the illustrative embodiment and executed when an initialize switch is pushed.

In response to the initialization command 300, the plug-in control unit 70 starts executing a sequence of steps shown in FIG. 5 for setting up an automatic connection/disconnection environment. As shown, the control unit 70 clears an insertion flag and an insertion stand-by flag stored in a memory, not shown, to thereby inhibit all interrupts (step S10). The control unit 70 then causes the motor control unit 72 to feed preselected drive pulses 310 and 312 to the plug-in mechanisms 52 and 54, respectively. The drive pulses 310 and 312 cause the two stepping motors 204 to rotate in its reverse direction in synchronism with each other (step S12) Consequently, the disk 206 of each plug-in mechanism 52 or 54 rotates until its lug 218 abuts against the stop 222, as shown in FIG. 8A.

After the step S12, the plug-in control unit 70 waits for about 500 milliseconds (step S14) in the embodiment. In this initial state, the operator inserts the circuit board 12 to a position where the bottoms of the locking members 24 and 26 respectively push down the switch buttons 208 of the microswitches 202 included in the plug-in mechanisms 52 and 54, as shown in FIG. 8A. As a result, the microswitches 202 are turned on. At this instant, the lugs 218 of the disks 206 each are positioned substantially beneath the associated locking member 24 or 26.

On the elapse of 500 milliseconds (step S14) the plug-in control unit 70 determines the ON/OFF states of the microswitches 202 on the basis of signals 314 and 316 output from the microswitches 202 (step S16). The control unit 70 advances to a step S20 if the microswitch 202 of the plug-in mechanism 52 is in its ON state (Yes, step S18) or returns to the step S16 other wise (No, step S18). By repeating the steps S16 and S18, the control unit 70 waits until the microswitch 202 of the plug-in mechanism 54 turns on. In the step S20, the control unit 70 determines whether or not the microswitch 202 of the other plug-in mechanism 54 is in its ON state. The control unit 70 advances to a step S22 if the answer of the step S20 is Yes or returns to the step S16 if it is No. Usually, the microswitches 202 of the plug-in mechanisms 52 and 54 turn on at the same time and turn off at the same time.

If the microswitches 202 of the plug-in mechanisms 52 and 54 both are in the ON state thereof (Yes, step S20), the plug-in control unit 70 controls the motor driver 74 via the motor control unit 72 for causing it to feed drive pulses 310 and 312 to the plug-in mechanisms 52 and 54, respectively. The drive pulses 310 and 312 cause the stepping motors 204 of the plug-in mechanisms 52 and 54 to rotate by a predetermined number of steps in the forward direction (207, FIG. 8B) in synchronism with each other (step S22). Consequently, as shown in FIG. 8B, the lugs 218 of the disks 206 respectively abut against the edges of the notches formed in the locking members 24 and 26 while the two microswitches 202 turn off.

After the step S22, the plug-in control unit 70 again waits for 500 milliseconds (step S24). On the elapse of this period of time, the control unit 70 determines the ON/OFF states of the microswitches 202 included in the plug-in mechanisms 52 and 54 on the basis of the signals 314 and 316, respectively (step S26). If the microswitches 202 both are in the OFF state thereof (Yes, step S28), then the control unit 70 advances to a step S30. However, if the microswitches 202 both are still in the ON state (No, step S28), then the control unit 70 repeats the step S10 and successive steps all over again, determining that the condition shown in FIG. 8B has not been set up due to some error.

In the step S30, the plug-in control unit 70 sets the insertion stand-by flag stored in the memory. The control unit 70 then cancels the interrupt inhibition (step S32). As a result, the circuit board 12 is brought into the insertion stand-by state. In this stand-by state, the circuit board connector 50 of the circuit board 12 is ready to be connected to the mother board connector 16 under the control of the plug-in control board 14.

After the interrupt inhibition has been canceled, the operator pushes the connect switch 78 positioned on the plug-in control board 14. In response, the connect switch 78 sends out an insertion command 302 to the plug-in control unit 70. In response to the insertion command 302 or an insertion command input from the outside over the PCI bus, the control unit 70 executes a procedure shown in FIG. 6 for the automatic connection of the circuit board 12. As shown, the control unit 70 reads the insertion stand-by flag out of the memory (step S40). If the insertion stand-by flag is set, meaning that the circuit board 14 is held in the insertion stand-by state (Yes, step S42), then the control unit 70 executes a step S44. If the answer of the step S42 is No, then the control unit 70 returns to the step S10, FIG. 5.

In the step S44, the plug-in control unit 70 determines the ON/OFF states of the microswitches 202 on the basis of the signals 314 and 316, which are respectively output from the plug-in mechanisms 52 and 54. If the microswitches 202 both are in the OFF state thereof (Yes, step S46), then the control unit executes a step S48. If not, i.e. both of the microswitches 202 are in the OFF state thereof (No, step S46), then the control unit 70 returns to the step S10, FIG. 5.

In the step S48, the plug-in control unit 70 controls the motor driver 74 via the motor control unit 72 for causing it to feed drive pulses 310 and 312 to the plug-in mechanisms 52 and 54, respectively. In response, the stepping motors 204 of the plug-in mechanisms 52 and 54 rotate forward in synchronism with each other. At this instant, the lugs 218 of the disks 206 rotate in a direction indicated by an arrow 205 in FIG. 8B, pushing the inner edges of the locking members 24 and 26, respectively. Consequently, the circuit board 12 is inserted into the mother board 10. The stepping motors 204 stop rotating when the associated lugs 218 abut against the stops 220, as shown in FIG. 8C. At this instant, the circuit board connector 50 is connected to the mother board connector 16. At the same time, the microswitches 202 turn on.

Finally, the plug-in control unit 70 sets the insertion flag stored in the memory and then ends the procedure described above (step S50). In this manner, by the steps S40 through S50, the circuit board connector 50 is connected to the mother board connector 16, i.e., the circuit board 12, which was physically separated, has automatically been inserted into the mother board 10.

To drive the circuit board 12 out of the mother board 10, the operator depresses the disconnect switch 80 positioned on the plug-in control board 14. In response to a disconnection command 304 output from the disconnect switch 80, the plug-in control unit 70 executes a procedure shown in FIG. 7 for the automatic removal of the circuit board 12. This is also true when the control unit 70 receives a discharge command from the outside on the PCI bus. As shown in FIG. 7, the control unit 70 reads out the insertion flag from the memory (step S60) and sees that the circuit board 12 is inserted in the mother board 10. More specifically, if the insertion flag is set (Yes, step S62), then the control unit 70 executes a step S64. If the insertion flag is not set (No, step S62), then the control unit 70 returns to the step S60 and waits until the circuit board 12 has been inserted into the mother board 10.

In the step S64, the plug-in control unit 70 controls the motor driver 74 via the motor control unit 72 for causing it to feed preselected drive pulses 310 and 312 to the plug-in mechanisms 52 and 54, respectively. The drive pulses 310 and 312 respectively cause the stepping motors 204 of the plug-in mechanisms 52 and 54 to rotate in the reverse direction in synchronism with each other. The lugs 218 of the disks 206 therefore rotate in a direction indicated by an arrow 209 in FIG. 8D while pushing the inner edges of the locking members 24 and 26. The stepping motors 204 stop rotating when the associated lugs 218 abut against the stops 222, as shown in FIG. 8A. As a result, the microswitches 202 of the plug-in mechanisms 52 and 54 turn on. At the same time, the circuit board connector 50 is fully released from the mother board connector 16.

After the step S64, the plug-in control unit 70 references the signals 314 and 316 to see the ON/OFF states of the microswitches 202 included in the plug-in mechanisms 52 and 54 (step S66) The control unit 70 executes a step S70 if the microswitches 202 both are in the ON state thereof (Yes, step S62) or otherwise returns to the step S60 (No, step S62). In the step S70, the control unit 70 clears the insertion flag and then ends the procedure shown in FIG. 7. Thereafter, the operator can pull the entire circuit board 14 out of the mother board 10 by hand.

As stated above, the circuit board connector 50 of the circuit board 12 is automatically released from the mother board connector 16 of the mother board 10, thus electrically disconnecting the circuit board 12 from the mother board 10. This can be done without resorting to an expensive bus disconnecting circuit which would otherwise be provided on the circuit board 12 for interrupting the electrical connection of the circuit board 12 with the mother board 10. The illustrative embodiment therefore implements an inexpensive, highly available system and saves the area of the circuit board 12 otherwise assigned to the bus disconnecting circuit.

If desired, two circuit boards each having the configuration stated earlier may be prepared, although not shown specifically, and one is brought into its active state and the other its stand-by circuit state. In such a case, the plug-in control unit 70 monitors the operation of the active circuit board in operation. When the active circuit board connected to the mother board 10 fails, it is immediately disconnected from the mother board 10 and replaced in active state with the other circuit board which has been in its stand-by state. This prevents the operation of the system from being interrupted.

In the illustrative embodiment, the plug-in mechanisms 52 and 54 and locking members 24 and 26 are mounted on the circuit board 12 and guide rails 20 and 22, respectively. The plug-in mechanisms 52 and 54 and locking members 26 and 26 may be replaced with each other, if desired. Such an alternative configuration allows the control cables 56 and 58 and control cable connectors 28, 30, 60 and 62 to be omitted.

Figure 9:
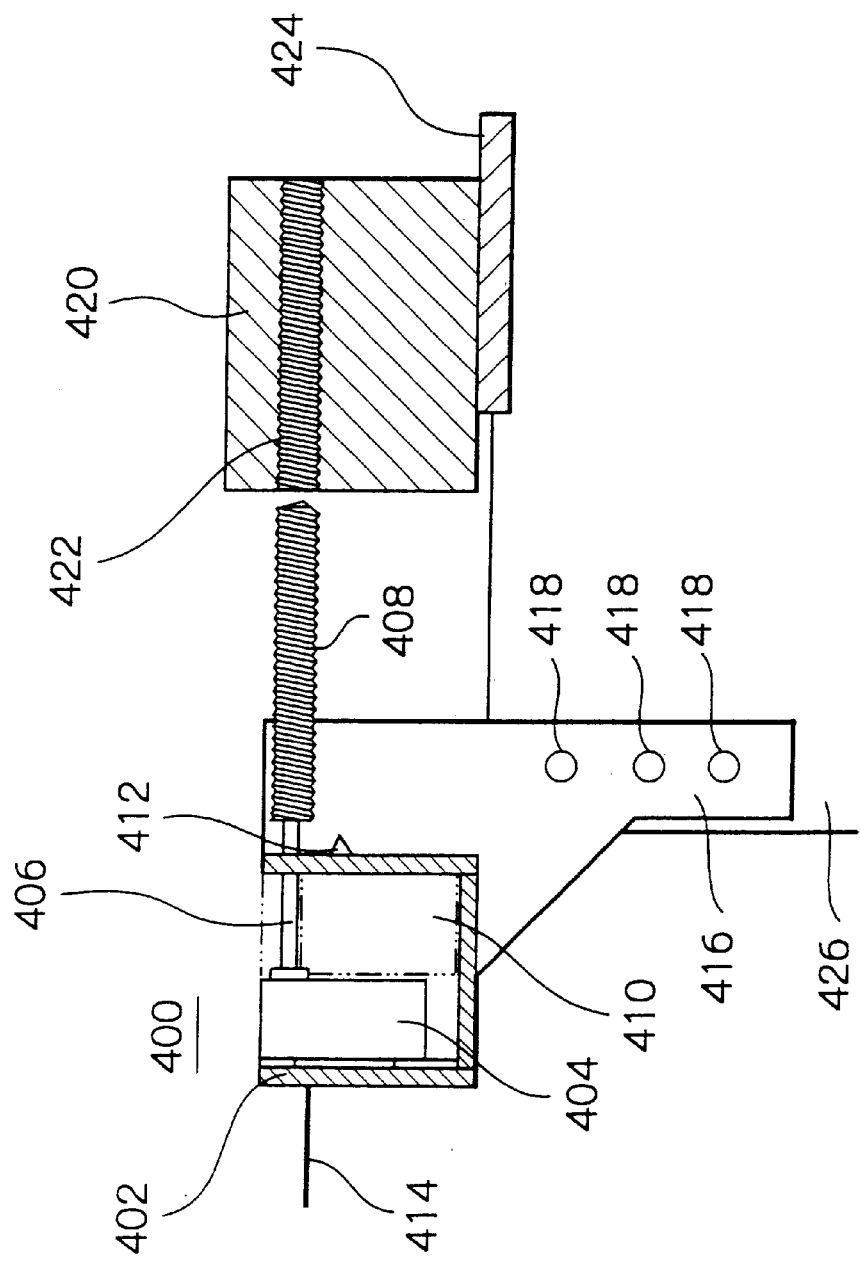
FIG. 9 shows in a partly sectional view another specific configuration an actuator.

FIG. 9 shows another specific configuration of the plug-in actuator. As shown, the actuator includes a plug-in mechanism 400 and an affixing block 420 in place of the plug-in mechanism 52 or 54 and locking member 24 or 26, FIG. 1. The plug-in mechanism 400 includes a stepping motor 404 and a screw 408 driven by the stepping motor 404. The affixing block 420 is mounted on the frame and includes a screw-threaded hole 422 for receiving the screw 408. The screw 408 is inserted into the screw-threaded hole 422 and then rotated to move a circuit board 426. With this configuration, the actuator enhances accurate position control.

More specifically, the plug-in mechanism 400 and affixing block 420 correspond to the plug-in mechanism 52 and locking member 24, FIG. 1, respectively. The plug-in mechanism 400 includes a chassis 402 and a bracket 416 mounted on the circuit board 426 and supporting the chassis 402. The chassis 402 accommodates a microswitch 410 as well as the stepping motor 404. The stepping motor 404 is a screw drive source for rotating the screw 408 mounted on a shaft 406. In the illustrative embodiment, the stepping motor 404 is driven with a gear ratio of 200:1 by drive pulses input on a control cable 414. The shaft 406 with the screw 408, which has a preselected length, is affixed to the output shaft of the stepping motor 404 at its one end and driven thereby. The shaft 406 has its other end rotatably supported by a hole formed in the chassis 402.

The microswitch 410 is mounted on the chassis 402 such that a switch button 412 included in the microswitch 410 protrudes sideways from one side wall of the chassis 402 adjoining the screw 408. The chassis 402 is affixed to the bracket 416 formed with a plurality of screw holes 418. Screws, not shown, are driven into the circuit board 426 via the screw holes 418 to thereby fasten the chassis 402 to the circuit board 426. The affixing block 420 with the screw-threaded holes 422 is mounted on one end of a guide rail 424 formed with a channel for guiding the circuit board 426. The chassis 402 and affixing block 420 are positioned relative to each other such that the screw 408 can be driven into the screw-threaded hole 422.

In operation, while the end of the screw 408 is held in contact with the screw-threaded hole 422, drive pulses are fed to the stepping motor 404 on the control cable 414. The drive pulses cause the stepping motor 404 to rotate, e.g., forward, thereby driving the screw 408 into the screw-threaded hole 422. As a result, the circuit board 426 is inserted into the mother board, not shown, little by little. When the circuit board connector, not shown, mounted on the circuit board 426 fully mates with the mother board connector, not shown, mounted on the mother board, the switch button 412 of the microswitch 410 abuts against the side wall of the affixing block 420. Consequently, the side wall of the affixing block 420 presses the switch button 412 into the chassis 402 for thereby causing it to turn on.

The microswitch 410 sends out a sense signal representative of the ON state of the switch button 412 to the plug-in control board 14, not shown, on the control cable 414. In response, the plug-in control board 14 stops feeding the drive pulses to the stepping motor 404 and thereby causes the stepping motor 404 to stop rotating. To disconnect the circuit board connector from the mother board connector, the stepping motor 404 is rotated in its reverse direction.

The configuration shown in FIG. 9 realizes highly accurate control over the position of the circuit board if a play between the screw 408 and the screw-threaded hole 422 is reduced. Further, by increasing the length of the screw 408, it is possible to increase the automatic plug-in stroke. In addition, the number of parts constituting the plug-in mechanism is reduced because of the absence of gears. The microswitch 410 may be replaced with an optical or a magnetic sensor, if desired. Also, the chassis 402 and affixing block 420 may be replaced with each other, in which case the control cable 414 can be directly connected to the mother board 10. This allows the control cable connectors 28, 30, 60 and 62 and control cables 33 and 34 to be omitted.

Reference will be made to FIG. 10 for describing an alternative embodiment of the present invention. As shown, the illustrative embodiment additionally includes loop circuits 523 and 525 responsive to currents to flow through a power supply pin and signal pins, respectively, included in the mother board connector 16, as will be described specifically later. The illustrative embodiment finely adjusts the positions of the disks 206 for setting up a hot stand-by state that electrically disconnects signal lines while maintaining a power supply line electrically connected.

Figure 11A:
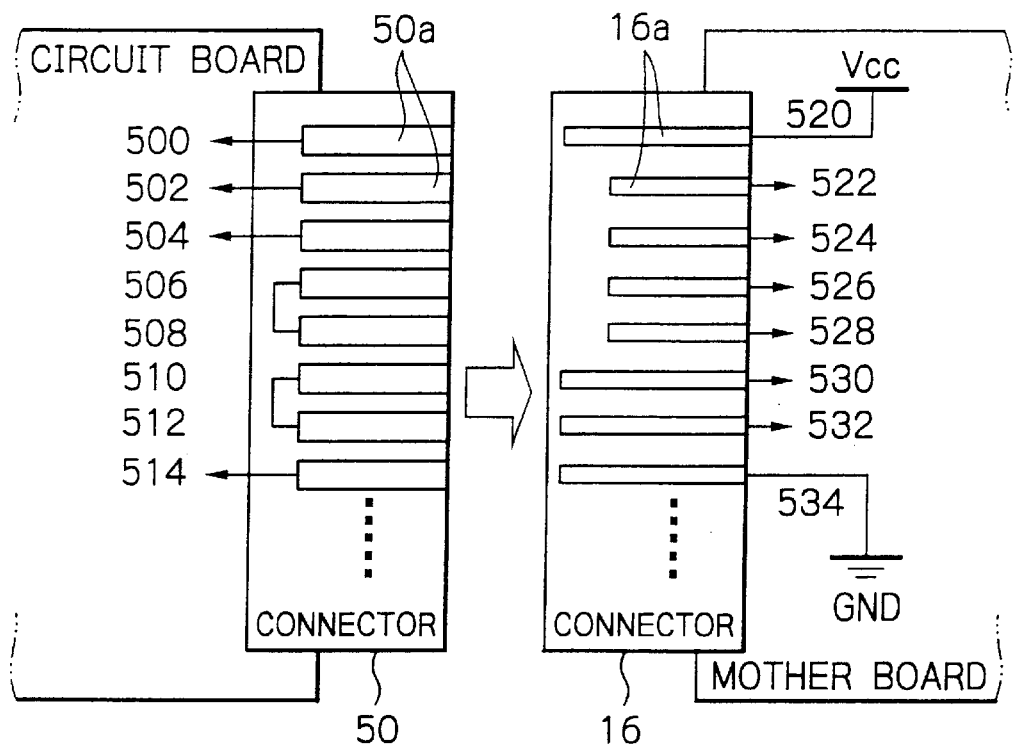
FIGS. 11A through 11C are views useful for understanding the operation of the alternative embodiment.
Figure 11B:
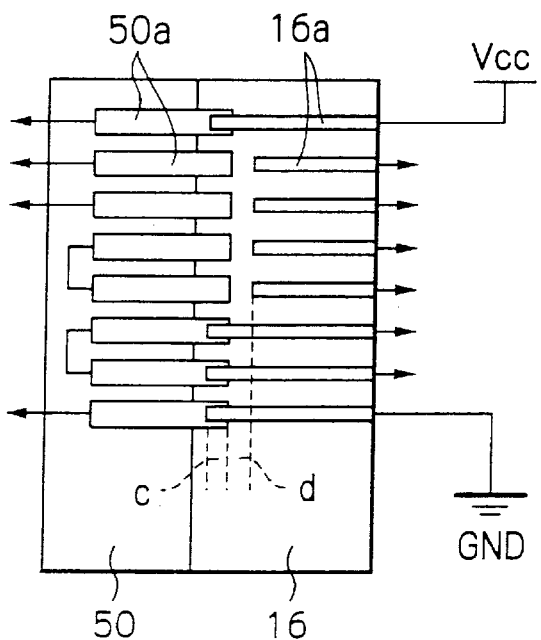
Figure 11C:
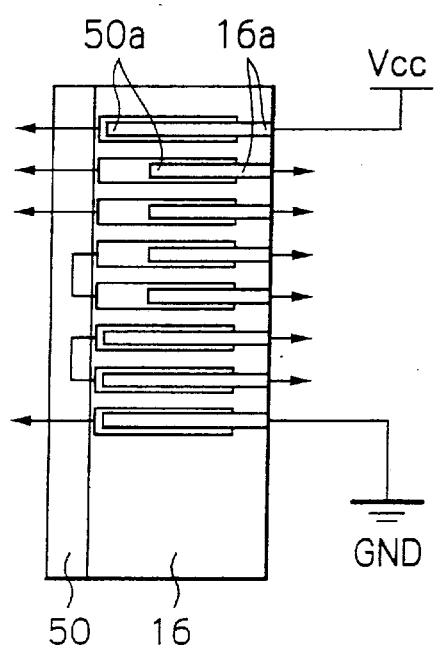

More specifically, as shown in FIG. 11A, a circuit board connector 50 is mounted on the circuit board 12 and includes a power supply contact 500, signal contacts 502 and 504, signal sense contacts 506 and 508, power supply sense contacts 510 and 512, and a ground contact 514. The mother board connector 16 mounted on the mother board 10 includes a power supply pin 520, signal pins 522 and 524, signal sense pins 526 and 528, power supply sense pins 530 and 532, and a ground pin 534. The contacts, labeled 50a, of the circuit board connector 50 each mate with corresponding one of the pins, labeled 16a, of the mother board connector 16.

The power supply pin 520, power supply sense pins 530 and 532 and ground pin 534 have the same length as each other, and so do the signal pins 522 and 524 and signal sense pins 526 and 528. The pins 522 through 528 are slightly shorter than the pins 520 and 530 through 534. Therefore, when the circuit board connector 50 is inserted into the mother board connector 16, the pins 520, 530, 532 and 534 mate with the contacts 500, 510, 512 and 514, respectively, and then the pins 522 through 528 mate with the contacts 502 through 508, respectively. It is to be noted that the signal sense contacts 506 and 508 are connected together, i.e., short-circuited, and so are the power supply sense contacts 510 and 512.

As shown in FIG. 10, the signal sense pins 526 and 528 and power supply sense pins 530 and 532 of the mother board connector 16 are connected to the plug-in control unit 70 via the mother board connector 18 and a circuit board connector 82, which is mounted on the plug-in control board 14. In this arrangement, the loop circuit 525 assigned to signal pins includes the contacts 506 and 508 and pins 526 and 528 while the loop circuit 523 assigned to a power supply pin includes the contacts 510 and 512 and pins 530 and 532. The loop circuits 523 and 525 are connected to the plug-in control unit 70. The control unit 70 includes a loop detector circuit, not shown, adapted for determining whether the loop circuits 523 and 525 are open or closed. More specifically, the loop detector circuit is responsive to the conduction state between the signal pins 522 and 524 and the signal contacts 502 and 504 and the conduction state between the power supply pin 520 and the power supply contact 500.

A specific operation of the illustrative embodiment will be described with reference to FIGS. 11A through 11C, 12A, 12B and 13. Assume that the plug-in control board 14 is in its active state, and that the circuit board 12 is held in the insertion stand-by state set up by the sequence of steps S10 through S32 shown in FIG. 5. When the operator pushes the connect switch 78 positioned on the plug-in control board 14, the connect switch 78 sends out an insertion command 302 to the plug-in control unit 70.

Figure 12B:
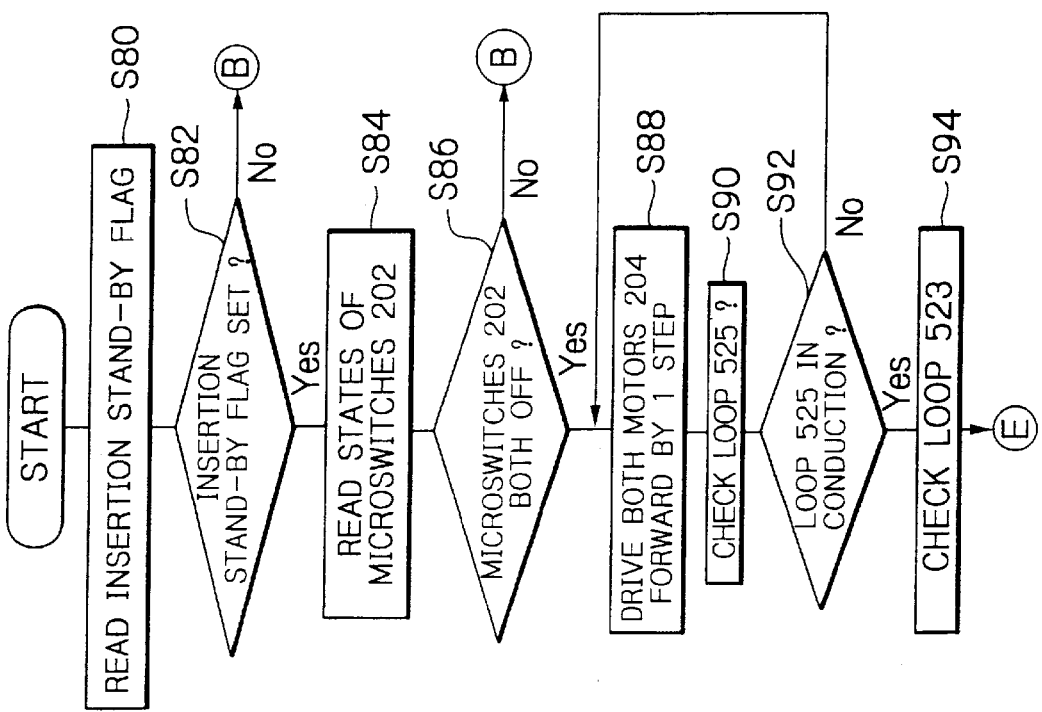
FIGS. 12A and 12B are flowcharts useful for understanding a procedure available with the alternative embodiment and executed when the connect switch is pushed.
Figure 12A:
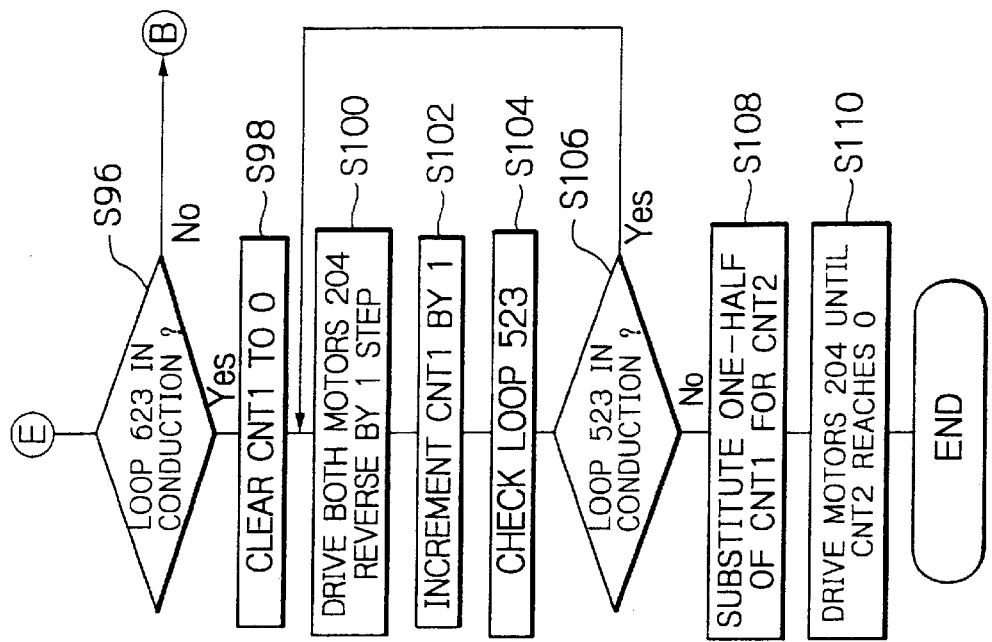
Figure 13:
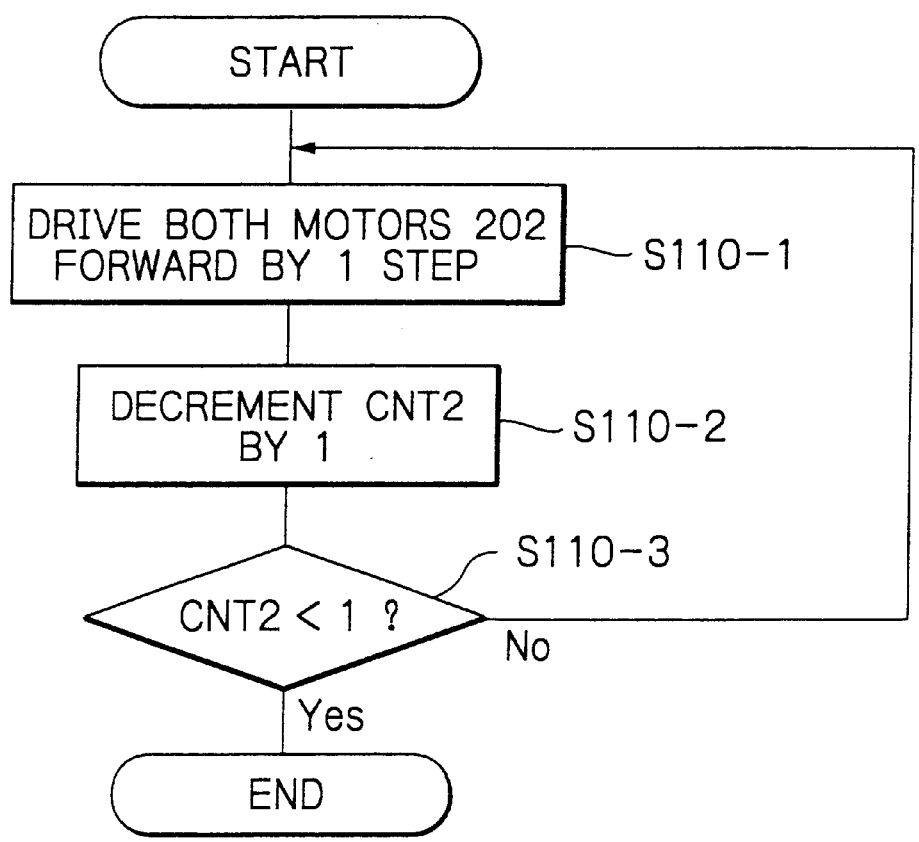
FIG. 13 is a flowchart showing a subroutine included in the procedure of FIG. 12b in detail.

When the plug-in control unit 70 receives the insertion command 302 or an insertion command from the outside over the PCI bus, the control unit 70 exerts automatic plug-in processing shown in FIGS. 12A, 12B and 13. It is to be noted that steps S80 through S86 shown in FIG. 12A are identical with the steps S40 through S46 of FIG. 6 and will not be described specifically in order to avoid redundancy.

If the microswitches 202 of the plug-in mechanisms 52 and 54 both are in their OFF state (Yes, step S86) then the plug-in control unit 70 controls the motor driver 74 via the motor control unit 72. The motor driver 74 feeds drive pulses 310 and 312 to the plug-in mechanisms 52 and 54, respectively (step S88). The drive pulses 310 and 312 respectively cause the stepping motors 204 of the plug-in mechanisms 52 and 54 to rotate forward by one step in synchronism with each other. As a result, the lugs 218 of the disks 206 each rotate by a preselected angle in the direction indicated by the arrow 207 in FIG. 8B while pressing the inner edge of the locking member 24 or 26. The circuit board 12 therefore approaches the mother board 10 by a distance corresponding to one step.

Subsequently, the plug-in control unit 70 determines whether or not the input end of the loop circuit 525 responsive to the signal pins is in conduction, i.e., closed (step S90) If the input end is in conduction (Yes, step S90), then the control unit 70 executes a step S94. If the input end is not in conduction, i.e., open (No, step S90), then the control unit 70 returns to the step S88 and again causes the stepping motors 204 to rotate forward by one step in synchronism with each other. As the control unit 70 repeats the steps S88 through S92, the circuit board connector 50 of the circuit board 12 is inserted deeper into the mother board connector 16 of the mother board 10. At the time when conduction is set up at the inlet end of the loop circuit 525, the signal sense contacts 506 and 508 of the circuit board connector 50 make contact with the signal sense pins 526 and 528 of the mother board connector 16, respectively. Consequently, a distance d shown in FIG. 11B becomes zero.

In the step S94, the plug-in control unit 70 determines whether or not the input end of the loop circuit 523 responsive to the power supply pin is closed. If the inlet end is closed (Yes, step S95), then the control unit 70 executes a step S98. If the inlet end is open (No, step S95), then the control unit 70 returns to the step S10, FIG. 5, for initialization, determining that some error has occurred. In the illustrative embodiment, the power supply sense pins 530 and 532 are longer than the signal sense pins 526 and 528, as stated earlier. Therefore, so long as the system is free from errors, the input end of the loop circuit 523 is, of course, closed when the input end of the loop circuit 525 is closed.

In the step S98, the plug-in control unit 70 resets a counter CNT1 included in the memory to zero. Subsequently, the control unit 70 controls the motor driver 74 via the motor control unit 72 for causing it to feed drive pulses 310 and 312 to the plug-in mechanisms 52 and 54, respectively (step S100). The drive pulses 310 and 312 respectively cause the stepping motors 204 of the plug-in mechanisms 52 and 54 to rotate by one step in the reverse direction in synchronism with each other. The lugs 218 of the disks 206 therefore each rotate in the direction indicated by the arrow 209 in FIG. 8D while pressing the inner edges of the locking member 24 or 26.

After the step S100, the plug-in control unit 70 increments the counter CNT1 by one (step S102) and then checks the loop circuit 525 as to conduction (step S104). If the loop circuit 525 is open (No, step S106), then the control unit 70 executes a step S108. If the loop circuit 525 is still closed (Yes, step S106), then the control unit 70 returns to the step S100 and again causes the stepping motors 204 to rotate by one step in the reverse direction in synchronism with each other. The control unit 70 repeats the steps S100 through S106 with the result that the circuit board 12 moves away from the mother board 10. At the time when the input end of the loop circuit 525 is opened, the contacts 510 and 512 are respectively released from the pins 530 and 532, making a distance c shown in FIG. 11B zero.

In the step S108, the plug-in control unit 70 loads a counter CNT2, which is also included in the memory, with one-half of the value of the counter CNT1 while omitting fractions. Subsequently, the control unit 70 executes a subroutine S110 for again moving the circuit board 12 toward the mother board 10 until the value of the counter CNT2 decreases to zero. More specifically, as shown in FIG. 13, the control unit 70 causes the motor driver 74 to feed drive pulses 310 and 312 to the plug-in mechanisms 52 and 54, respectively, via the motor control unit 72 (step S110-1).

The stepping motors 204 of the plug-in mechanisms 52 and 54 rotate forward by one step in synchronism in accordance with the drive pulses 310 and 312, respectively. This causes each of the lugs 208 of the disks 206 to rotate by a preselected angle in the direction 205 shown in FIG. 8B while pressing the inner edge of the locking member 24 or 26. Consequently, the circuit board 12 moves toward the mother board 10. Subsequently, the plug-in control unit 70 decrements the value of the counter CNT2 by one (step S110-2) and then determines whether or not the counter CNT2 has reached a value less than one, i.e., zero or below (step S110-3). The control unit 70 ends the subroutine if the answer of the step S110-3 is Yes or returns to the step S110-1 if it is No.

By the steps S80 through S110 shown in FIGS. 12A and 12B, the circuit board 12 is first inserted into the mother board 10 to the position where the distance d, FIG. 11B, is zero, then pulled out to the position where the distance c, FIG. 11B, is zero, and again inserted into the mother board 10 to a position where the distances c and d are equal to each other. In the last position, the power supply contact 500 and ground contact 514 of the circuit board connector 50 are respectively brought into contact with the power supply pin 520 and ground pin 534 of the mother board connector 16. However, the signal contacts 502 and 504 are not in contact with the signal pins 522 and 524.

As stated above, the illustrative embodiment automatically sets up a so-called hot stand-by state in which only a power source line is connected, but signal lines are disconnected, i.e., the circuit board 12 is supplied with power, but not with signals. To release the circuit board 12 from the mother board 10, the procedure described with reference to FIG. 7 is executed.

In an application in which two or more CPU units (circuit boards 12) in accordance with the illustrative embodiment are applied to an electronics system, one CPU unit is held in its active state while the other CPU unit is in its hot stand-by state with its OS (Operation System) remaining in the operative state. When the active CPU unit fails, it is immediately driven out while the stand-by CPU unit is brought into the active state. This successfully reduces the time interval between power-up and the completion of start-up of the OS for thereby realizing rapid recovery.

The illustrative embodiments shown and described use a single plug-in control board to control a single circuit board. Alternatively, the plug-in control board may be loaded with a multi-input plug-in control unit and a multi-channel motor driver for controlling a plurality of circuit boards. This is desirable from the cost and space standpoint. If desired, the actuator shown in FIG. 9 may be applied to the embodiment shown in FIG. 10 for further promoting accurate plug-in control.

The present invention is desirably applicable to the automatic plug-in mechanism of a hard disk drive or that of an optical disk drive to be connected by connectors.

In summary, in accordance with the present invention, a circuit board plug-in system can automatically release the circuit board connector of a circuit board from the mother board connector of a mother board for thereby electrically disconnecting the circuit board from the mother board. Also, the position of the circuit board can be accurately controlled when use is made of a screw mounted on the circuit board and selectively driven to move the circuit board. Further, the position of the circuit board can be finely adjusted when the system additionally includes loop circuits for use in sensing the conduction of a power supply pin and the conduction of signal pins included in the mother board connector. Therefore, there can be implemented a hot stand-by state in which a power supply line is connected, but signal lines are disconnected.

The entire disclosure of Japanese patent application No. 2001-317737 filed on Oct. 16, 2001, including the specification, claims, accompanying drawings and abstract of the disclosure is incorporated herein by reference in its entirety.

While the present invention has been described with reference to the particular illustrative embodiments, it is not to be restricted by the embodiments. It is to be appreciated that those killed in the art can change or modify the embodiments without departing from the scope and spirit of the present invention.

What is claimed is:

1. A circuit board plug-in system comprising:
   a frame;
   a mother board mounted on said frame and comprising a mother board connector;
   a circuit board comprising a circuit board connector mating with said mother board connector;
   a pair of guide rails mounted on said frame and each being formed with a channel for insertion of said circuit board;
   an actuator for moving said circuit board inserted into said pair of guide rails to thereby selectively connect or disconnect said circuit board connector to or from said mother board connector; and
   a plug-in control section for controlling said actuator;
   where in said actuator is arranged partly on said circuit board and partly on said pair of guide rails; and
   said plug-in control section is mounted on said frame.

2. The system in accordance with claim 1, wherein said actuator comprises:
   a locking member affixed to an end at least one of said guide rails remote from said mother board and formed with a notch; and
   a plug-in mechanism mounted on said circuit board and comprising a rotatable disk formed with a lug for pressing an edge of the notch of said locking member when said disk is rotated, and a disk drive source for causing said disk to rotate in accordance with a drive current;
   said plug-in control section generates a drive current for causing said disk to rotate in a preselected direction and feeds said drive current to said disk drive source; and
   when said disk rotates with said lug pressing the edge of the notch of said locking member, said circuit board moves on said guide rails in accordance with rotation of said disk.

3. The system in accordance with claim 2, wherein said locking member and said plug-in mechanism are affixed to said circuit board and the end of said guide rail, respectively.

4. The system in accordance with claim 2, wherein said plug-in mechanism further comprises a sensor for outputting a sense signal representative of a position of said circuit board relative to said mother board; and
   said plug-in control section generates the drive current in accordance with the sense signal output from said sensor.

5. The system in accordance with claim 2, wherein said plug-in mechanism further comprises a pair of stops for limiting a movable range of said lug of said disk; and
   said disk drive source stops rotating said disk when said lug abuts against either one of said pair of stops.

6. The system in accordance with claim 2, wherein said plug-in mechanism causes said lug of said disk to enter the notch of said locking member for thereby preventing said circuit board from being pulled out.

7. The system in accordance with claim 1, wherein said actuator comprises:
   an affixing block affixed to an end of at least one of said guide rails remote from said mother board and formed with a screw-threaded hole; and
   a plug-in mechanism mounted on said circuit board and comprising a screw capable of mating with the screw-threaded hole, and a screw drive source for causing said screw to rotate in accordance with a drive current;
   said plug-in control section generates a drive current for causing the screw to rotate in a preselected direction and feeds the drive current to said screw drive source; and
   when the screw mates with the screw-threaded hole and rotates, said circuit board moves on said guide rails in accordance with rotation of said screw.

8. The system in accordance with claim 7, wherein said affixing block and said plug-in mechanism are mounted on said circuit board and said guide rail, respectively.

9. The system in accordance with claim 7, wherein said plug-in mechanism further comprises a sensor for outputting a sense signal representative of a position of said circuit board relative to said mother board; and
   said plug-in control section generates the drive current in accordance with the sense signal output from said sensor.

10. The system in accordance with claim 2, wherein said circuit board connector comprises a power supply contact, a pair of signal contacts, a pair of power supply sense contacts connected to each other, a pair of signal sense contacts connected to each other, and a ground contact;
    said mother board connector comprises a power supply pin, a pair of signal pins, a pair of power supply sense pins, a pair of signal sense pins and a ground pin respectively connectable to said power supply contact, said pair of signal contacts, said pair of power supply sense contacts, said pair of signal sense contacts and said ground contact, said pair of signal pins and said pair of signal sense pins being smaller in length than said power supply pin, said pair of power supply sense pins, and said ground pins;
    said plug-in control section comprises a pair of loop circuits for respectively sensing conduction between said pair of power supply sense pins and conduction between said pair of signal sense pins; and
    said plug-in control section feeds the drive current to said disk drive source for moving said circuit board to thereby calculate a first insertion position where said pair of signal sense pins are short-circuited and a second insertion position where said pair of power supply sense pins are open, and then controls said disk drive source such that said circuit board reaches a position between said first insertion position and said second insertion position.

11. The system in accordance with claim 10, wherein said plug-in control section feeds drive pulses to said disk drive source to there by move said circuit board by a unit distance for a single pulse, counts said drive pulses with a counter to thereby determine a distance that said circuit board has moved from said first insertion position to said second insertion position, and feeds a number of drive pulses that is one-half of a number of said drive pulses counted to said disk drive source to thereby move said circuit board from said second position toward said first position.

12. The system in accordance with claim 7, wherein said circuit board connector comprises a power supply contact, a pair of signal contacts, a pair of power supply sense contacts connected to each other, a pair of signal sense contacts connected to each other, and a ground contact;

said mother board connector comprises a power supply pin, a pair of signal pins, a pair of power supply sense pins, a pair of signal sense pins and a ground pin respectively connectable to said power supply contact, said pair of signal contacts, said pair of power supply sense contacts, said pair of signal sense contacts and said ground contact, said pair of signal pins and said pair of signal sense pins being smaller in length than said power supply pin, said pair of power supply sense pins, and said ground pins;

said plug-in control section comprises a pair of loop circuits for respectively sensing conduction between said pair of power supply sense pins and conduction between said pair of signal sense pins; and said plug-in control section feeds the drive current to said screw drive source for moving said circuit board to thereby calculate a first insertion position where said pair of signal sense pins are short-circuited and a second insertion position where said pair of power supply sense pins are open, and then controls said screw drive source such that said circuit board reaches a position between said first insertion position and said second insertion position.

13. The system in accordance with claim 12, wherein said plug-in control section feeds drive pulses to said screw drive source to there by move said circuit board by a unit distance for a single pulse, counts said drive pulses with a counter to thereby determine a distance that said circuit board has moved from said first insertion position to said second insertion position, and feeds a number of drive pulses that is one-half of a number of said drive pulses counted to said screw drive source to thereby move said circuit board from said second position toward said first position.

14. The system in accordance with claim 1, wherein said plug-in control section controls connection and disconnection of a plurality of circuit boards from said mother board.

* * * * *